United States Patent
Höppel

(10) Patent No.: US 9,276,167 B2
(45) Date of Patent: Mar. 1, 2016

(54) LIGHT-EMITTING DIODE CHIP AND METHOD FOR PRODUCING THE SAME

(75) Inventor: Lutz Höppel, Alteglofsheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/820,999

(22) PCT Filed: Aug. 11, 2011

(86) PCT No.: PCT/EP2011/063881
§ 371 (c)(1),
(2), (4) Date: May 16, 2013

(87) PCT Pub. No.: WO2012/031852
PCT Pub. Date: Mar. 15, 2012

(65) Prior Publication Data
US 2013/0228798 A1    Sep. 5, 2013

(30) Foreign Application Priority Data
Sep. 10, 2010    (DE) .......................... 10 2010 044 986

(51) Int. Cl.
*H01L 33/02* (2010.01)
*H01L 33/20* (2010.01)
*H01L 33/38* (2010.01)
*H01L 33/40* (2010.01)
*H01L 33/44* (2010.01)
(Continued)

(52) U.S. Cl.
CPC ............... *H01L 33/02* (2013.01); *H01L 33/20* (2013.01); *H01L 33/382* (2013.01); *H01L 33/405* (2013.01); *H01L 33/44* (2013.01); *H01L 33/0079* (2013.01); *H01L 33/22* (2013.01); *H01L 2924/0002* (2013.01)

(58) Field of Classification Search
CPC ................................. H01L 21/00; H01L 29/10
See application file for complete search history.

(56) References Cited

U.S. PATENT DOCUMENTS

2003/0230754 A1   12/2003   Steigerwald et al.
2007/0290215 A1   12/2007   Kato et al.
2008/0048206 A1   2/2008   Lee et al.
(Continued)

FOREIGN PATENT DOCUMENTS

CN    101132040 A    2/2008
CN    101681958 A    3/2010
(Continued)

*Primary Examiner* — Fernando L Toledo
*Assistant Examiner* — Valerie N Newton
(74) *Attorney, Agent, or Firm* — McDermott Will & Emery LLP

(57) ABSTRACT

A light-emitting diode chip is specified, comprising
an n-conducting region (1),
a p-conducting region (2),
an active region (3) between the n-conducting region (1) and the p-conducting region (2),
a mirror layer (4) at that side of the p-conducting region (2) which is remote from the active region (3), and
an insulation layer (5) formed with an electrically insulating material, wherein
the mirror layer (4) is designed for reflecting electromagnetic radiation generated in the active region (3), and
the mirror layer (4) has a perforation (41), wherein a side area (4a) of the mirror layer (4) is completely covered by the insulation layer (5) in the region of the perforation (41).

19 Claims, 7 Drawing Sheets

(51) Int. Cl.
    *H01L 33/00*    (2010.01)
    *H01L 33/22*    (2010.01)

(56) References Cited

U.S. PATENT DOCUMENTS

| | | |
|---|---|---|
| 2009/0020776 A1 | 1/2009 | Lin et al. |
| 2009/0267106 A1 | 10/2009 | Lee |
| 2010/0096652 A1 | 4/2010 | Choi et al. |
| 2010/0171135 A1 | 7/2010 | Engl et al. |
| 2010/0224898 A1 | 9/2010 | Kazama |
| 2011/0104836 A1* | 5/2011 | Rode et al. ............ 438/29 |

FOREIGN PATENT DOCUMENTS

| | | |
|---|---|---|
| DE | 10147886 A1 | 4/2003 |
| DE | 10 2007 022 947 A1 | 10/2008 |
| DE | 10 2008 030 584 A1 | 12/2009 |
| DE | 102009030243 A1 | 5/2010 |
| DE | 102009010480 A1 | 9/2010 |
| JP | 2010-103469 A | 5/2010 |
| JP | 2010-525585 A | 7/2010 |
| TW | 200816519 A | 4/2008 |
| TW | 200903863 A | 1/2009 |
| WO | WO-2009/155897 A1 | 12/2009 |

* cited by examiner

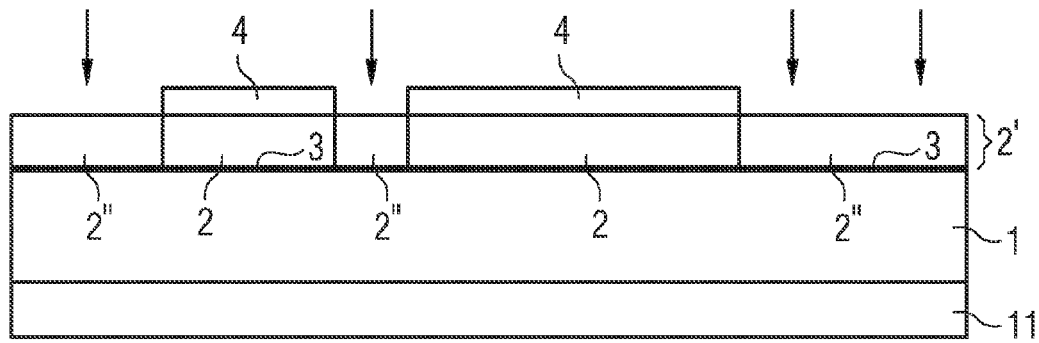
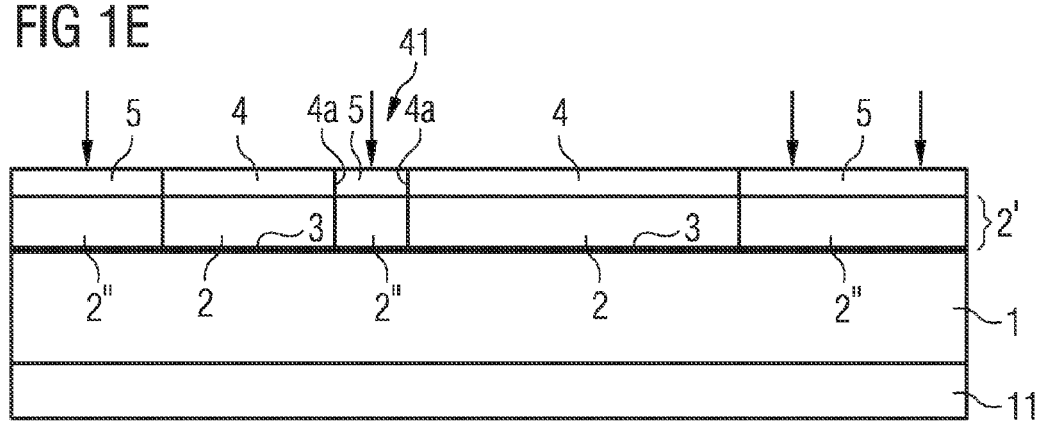
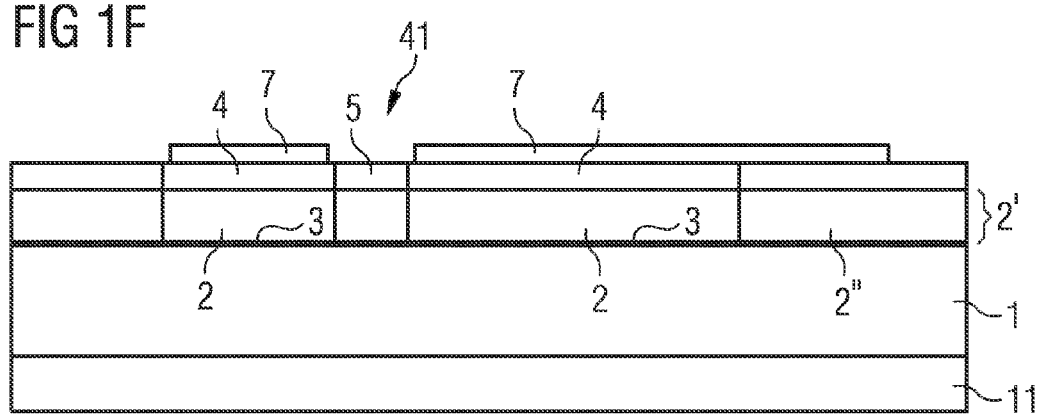

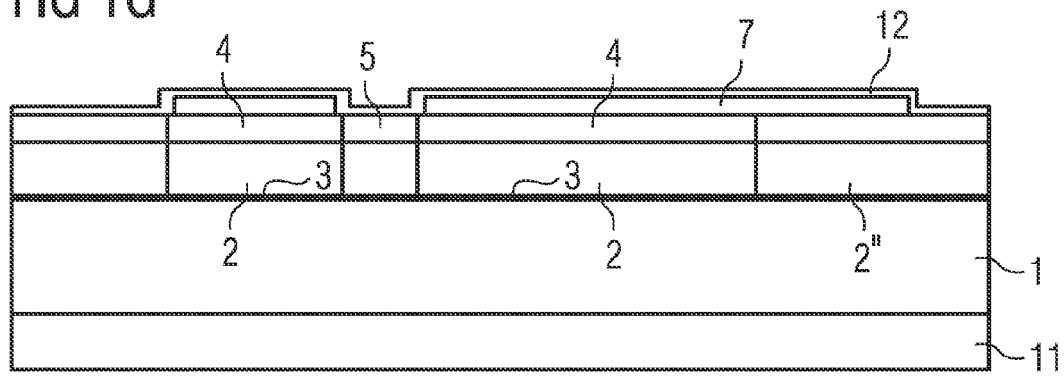
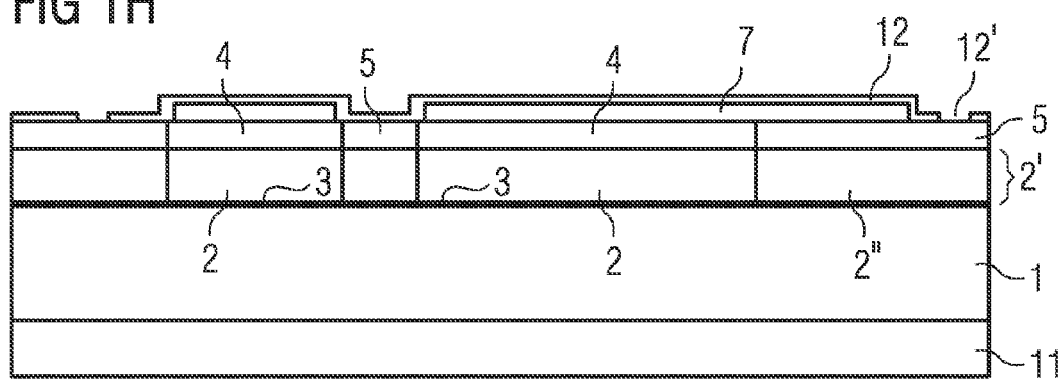
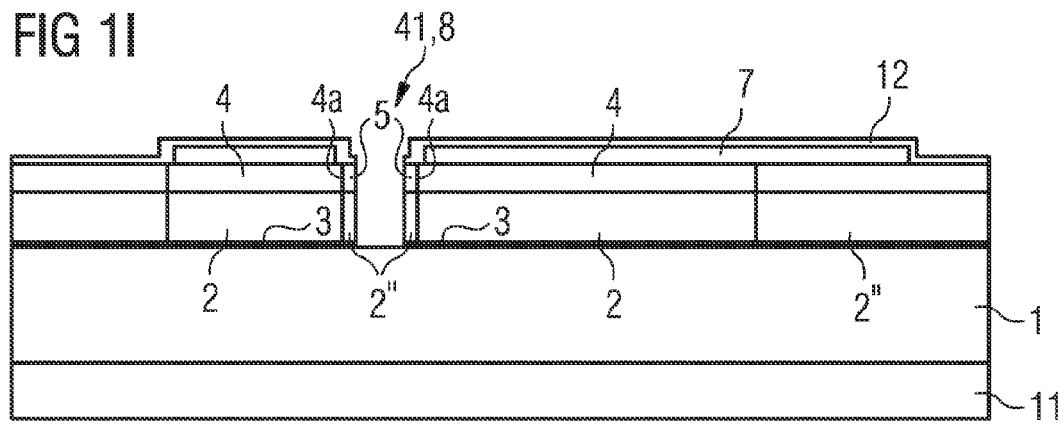

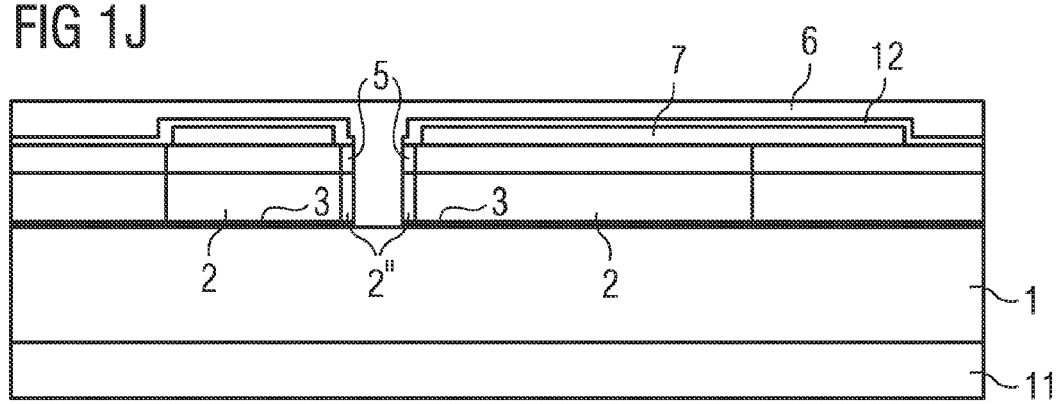
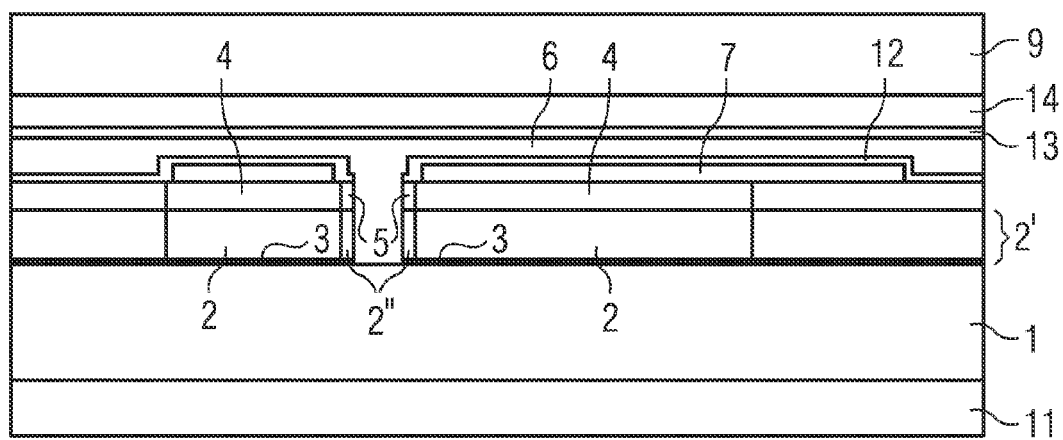

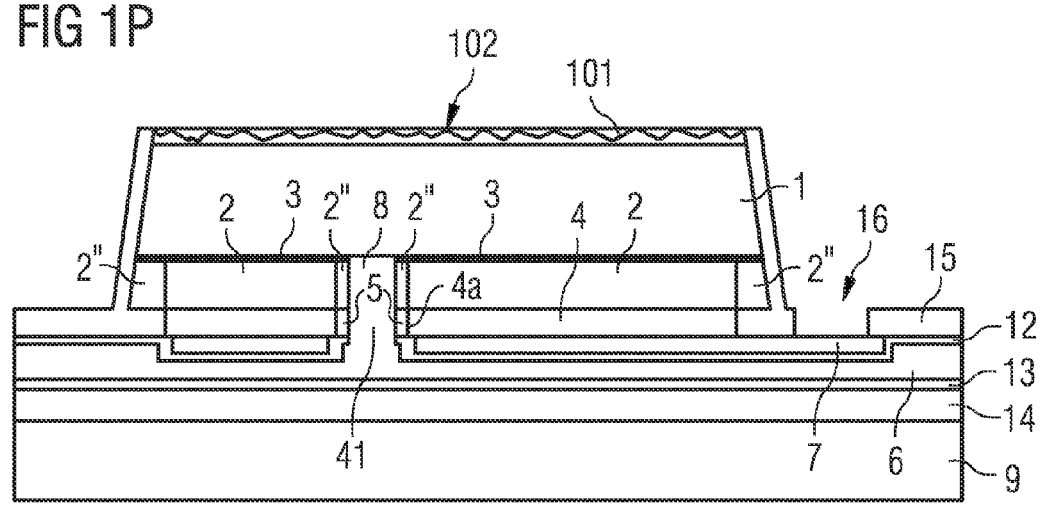
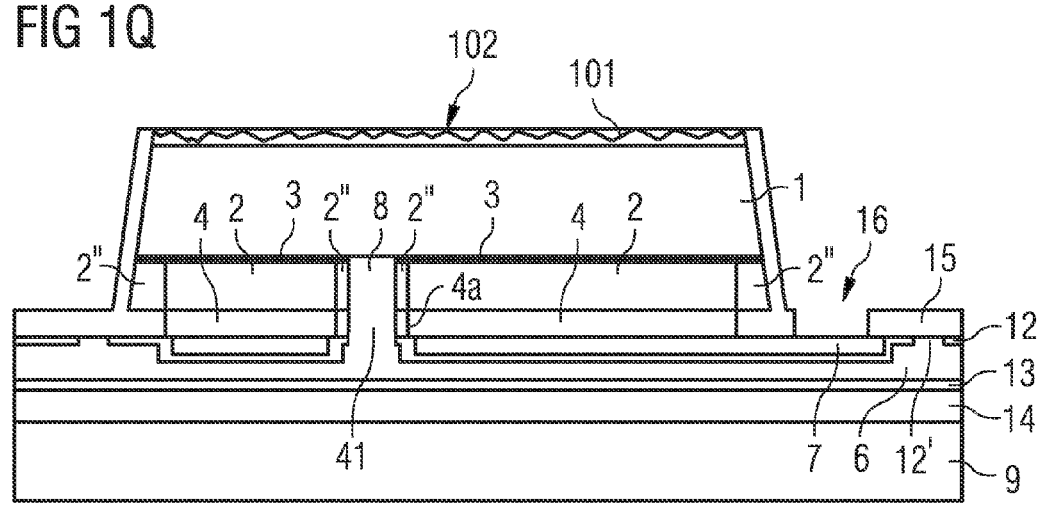

LIGHT-EMITTING DIODE CHIP AND METHOD FOR PRODUCING THE SAME

SUMMARY

A light-emitting diode chip is specified. Furthermore, a method for producing a light-emitting diode chip is specified.

One object consists in specifying a light-emitting diode chip which can be produced in a particularly simple manner.

In accordance with at least one embodiment of the light-emitting diode chip, the light-emitting diode chip comprises an n-conducting region, a p-conducting region and an active region between the n-conducting region and the p-conducting region. The conducting regions and also the active region are in this case preferably formed with a III-V compound semiconductor material. In particular, the conducting regions and the active region can be formed with a nitride-based compound semiconductor material.

A III/V compound semiconductor material comprises at least one element from the third main group, such as, for example, B, Al, Ga, In, and an element from the fifth main group, such as, for example, N, P, As. In particular, the term "III/V compound semiconductor material" encompasses the group of the binary, ternary or quaternary compounds which contain at least one element from the third main group and at least one element from the fifth main group, for example nitride and phosphide compound semiconductors. Such a binary, ternary or quaternary compound can additionally comprise, for example, one or a plurality of dopants and additional constituents.

In the present context, based on nitride compound semiconductor material means that the semiconductor layer sequence or at least one part thereof, particularly preferably at least the active zone and/or the growth substrate wafer, comprises or consists of a nitride compound semiconductor material, preferably $Al_nGa_mIn_{1-n-m}N$, where $0 \leq n \leq 1$, $0 \leq m \leq 1$ and $n+m \leq 1$. In this case, said material need not necessarily have a mathematically exact composition according to the above formula. Rather, it can comprise, for example, one or a plurality of dopants and additional constituents. For the sake of simplicity, however, the above formula only includes the essential constituents of the crystal lattice (Al, Ga, In, N), even if these can be replaced and/or supplemented in part by small amounts of further substances.

In this case, the active region is provided, during the operation of the light-emitting diode chip, for generating electromagnetic radiation for example from the frequency range between UV radiation and infrared radiation, in particular for generating visible light. For this purpose, the active region comprises, for example, a single quantum well structure or a multiple quantum well structure.

In accordance with at least one embodiment of the light-emitting diode chip, the light-emitting diode chip comprises a mirror layer, which is arranged at that side of the p-conducting region which is remote from the active region. The mirror layer is preferably designed to reflect electromagnetic radiation generated in the active region during the operation of the light-emitting diode chip in the direction of the p-conducting region. For this purpose, the mirror layer can contain a metal or consist of a metal. In particular, it is also possible for the mirror layer to comprise a plurality of sublayers that jointly form the mirror layer. In the present case, the mirror layer is preferably embodied in electrically conductive fashion.

In accordance with at least one embodiment of the light-emitting diode chip, the mirror layer has a perforation, wherein a side area of the mirror layer is completely covered by an insulation layer in the region of the perforation, said insulation layer being formed with an electrically insulating material. The perforation has at least one place in the mirror layer at which the mirror layer is completely removed. The perforation therefore constitutes an opening in the mirror layer. In the region of the perforation, the mirror layer has at least one side area which adjoins the perforation. The perforation is arranged in the mirror layer for example in such a way that the mirror layer laterally encloses the perforation. The perforation is then delimited towards the mirror layer by the at least one side area of the mirror layer.

In accordance with at least one embodiment of the light-emitting diode chip, said side area is completely covered by the insulation layer consisting of an electrically insulating material. That is to say that the insulation layer electrically passivates the side area of the mirror layer.

If the mirror layer in this case has a plurality of side areas which face the perforation, that is to say which laterally delimit the perforation, then preferably all the side areas of the mirror layer are completely covered by the insulation layer in the region of the perforation. In other words, the mirror layer is electrically passivated towards the perforation by the insulation layer.

The insulation layer preferably has the same thickness as the mirror layer, that is to say that the insulation layer preferably does not project beyond the mirror layer in a vertical direction. The vertical direction is a direction running transversely or perpendicularly with respect to a main extension plane of the mirror layer. Directions parallel to the main extension plane of the mirror layer are designated as lateral directions.

In accordance with at least one embodiment of the light-emitting diode chip, the light-emitting diode chip comprises an n-conducting region, a p-conducting region and an active region between the n-conducting region and the p-conducting region. Furthermore, the light-emitting diode chip has a mirror layer at that side of the p-conducting region which is remote from the active region. Furthermore, the light-emitting diode chip comprises an insulation layer formed with an electrically insulating material. In this case, the mirror layer is designed for reflecting electromagnetic radiation generated in the active region, and the mirror layer has a perforation, wherein a side area of the mirror layer is completely covered by the insulation layer in the region of the perforation.

In this case, the insulation layer proves to be useful not only as an electrically insulating layer during the operation of the light-emitting diode chip, but in particular also during the production of the light-emitting diode chip. By means of the insulation layer, a hollow groove or an undercut or a fillet can be formed in the edge region of the semiconductor body of the light-emitting diode chip which comprises the conducting regions and the active region, in which hollow groove a passivation layer for protecting the mirror layer can be arranged.

In accordance with at least one embodiment of the light-emitting diode chip, the remaining outer area of the mirror layer is free of the insulation layer. That is to say that the insulation layer is only arranged in the region of the perforation at the mirror layer. In particular, the insulation layer can be situated there in direct contact with the mirror layer. By contrast, other regions of the outer area of the mirror layer are free of the insulation layer. By way of example, the insulation layer is removed from other regions of the outer area of the mirror layer in the course of the production of the light-emitting diode chip.

In accordance with at least one embodiment of the light-emitting diode chip, the insulation layer can be etched by means of a phosphoric acid, in particular an orthophosphoric acid ($H_3PO_4$). This proves to be particularly advantageous since in this way, during the production of the light-emitting diode chip, the insulation layer can be removed jointly with semiconductor material which can likewise be etched by means of phosphoric acid, in particular orthophosphoric acid.

In accordance with at least one embodiment of the light-emitting diode chip, the insulation layer is formed with amorphous ceramic material or consists of amorphous ceramic material. In this case, in particular, the use of amorphous aluminium oxide (Al2O3) proves to be particularly advantageous since this material can be removed particularly easily using a phosphoric acid, in particular an orthophosphoric acid.

The insulation layer is produced by means of sputtering or vapour deposition, for example. In this case, "produced by means of sputtering" also designates, in particular, a substantive feature since a layer produced by means of sputtering can be distinguished from a differently produced layer, for example by examinations performed by electron microscopy.

In accordance with at least one embodiment of the light-emitting diode chip, the perforation in the mirror layer adjoins an opening extending through the p-conducting region and the active region right into or as far as the n-conducting region. In other words, an opening is formed through the p-conducting region and the active region, which opening can extend as far as or right into the n-conducting region. In this case, the opening does not completely penetrate through the n-conducting region. The opening is arranged in such a way that it adjoins the perforation, such that perforation and opening form a continuous cutout extending from the mirror layer as far as or right into the n-conducting region. In this case, perforation and opening are preferably produced separately from one another and centred with respect to one another. Perforation and opening can have the same dimensions in lateral directions.

In accordance with at least one embodiment of the light-emitting diode chip, the perforation and the opening are filled with an electrically conductive material, wherein the insulation layer is arranged between the electrically conductive material and the mirror layer. That is to say that the insulation layer separates the electrically conductive material from the mirror layer in an electrically insulating fashion. Therefore, there is no direct electrical connection between the electrically conductive material and the mirror layer. The electrically conductive material in perforation and opening preferably serves for making contact with the light-emitting diode chip on the n side. That is to say that the electrically conductive material is situated in electrically conductive contact with the n-conducting semiconductor material of the light-emitting diode chip. In this case, the electrically conductive material can be formed from a metal or with a metal which is reflective to the electromagnetic radiation generated in the active zone during the operation of the light-emitting diode chip. In other words, the electrically conductive material can be connected to a further mirror of the light-emitting diode chip or form a further mirror of the light-emitting diode chip.

In accordance with at least one embodiment of the light-emitting diode chip, the light-emitting diode chip has a radiation passage area, which is formed in places by an outer area of the n-conducting region which is remote from the p-conducting region. That is to say that a large part or the whole of the electromagnetic radiation emitted by the light-emitting diode chip during operation passes through the radiation passage area formed by an outer area of the n-conducting region. The radiation passes from there for example to a radiation exit area of the light-emitting diode chip, which can be formed by an outer area of a passivation layer which is remote from the n-conducting region. In this case, a current distribution for energizing the active region during the operation of the light-emitting diode chip is preferably effected below the radiation passage area formed by an outer area of the n-conducting region. That is to say, in particular, that the light-emitting diode chip at the radiation passage area is free of contact areas or current distribution structures which would absorb impinging electromagnetic radiation.

In accordance with at least one embodiment of the light-emitting diode chip, the mirror layer contains silver or the mirror layer consists of silver. Silver is a metal that tends towards migration towards so-called electromigration—in an electric field. In the case of the light-emitting diode chip described here, it is possible to protect the mirror layer against moisture in a particularly simple manner. For this purpose, by way of example, a dielectric, electrically insulating material is arranged in a hollow groove extending around the entire semiconductor body. Said hollow groove can be produced in a particularly simple manner by means of the insulating layer. Since silver tends towards migration in an electric field in particular under the influence of moisture and moisture can lead to corrosion of the mirror layer, a light-emitting diode chip described here proves to be particularly stable in respect of ageing.

In accordance with at least one embodiment of the light-emitting diode chip, an electrically conductive layer is arranged at that outer area of the mirror layer which is remote from the p-conducting region, said electrically conductive layer projecting beyond the mirror layer, the n-conducting region, the p-conducting region and the active region in a lateral direction, wherein the electrically conductive layer is freely accessible in places at its side facing the mirror layer. In other words, the electrically conductive layer is drawn away from the semiconductor body comprising the p-conducting region, the n-conducting region and the active region below the mirror layer towards the outside in a lateral direction. In this case, the electrically conductive layer is freely accessible in places from outside the light-emitting diode chip at its side facing the mirror layer. In its region freely accessible in places, the electrically conductive layer forms the p-side connection region of the light-emitting diode chip. In this way, the p-side connection region of the light-emitting diode chip is arranged in a manner spaced apart from the semiconductor body of the light-emitting diode chip in a lateral direction. This proves to be particularly advantageous if a conversion element for completely or partly converting the electromagnetic radiation generated in the active region into electromagnetic radiation having heavier wavelengths is intended to be arranged at the radiation passage area of the light-emitting diode chip. On account of the fact that the p-side connection region is arranged at a distance from the semiconductor body, the conversion element, for example, does not have to have a cutout for a contact wire. Furthermore, the contact wire does not disturb the process of applying the conversion element.

In accordance with at least one embodiment of the light-emitting diode chip, the electrically conductive material is separated from the electrically conductive layer in an electrically insulating fashion by means of a passivation layer, wherein the passivation layer has an opening filled with the electrically conductive material. The electrically conductive material in the opening surrounds the semiconductor body of the light-emitting diode chip circumferentially in a lateral direction. The opening in the passivation layer increases the resistance of the light-emitting diode chip towards moisture.

Furthermore, a method for producing a light-emitting diode chip is specified. For example, a light-emitting diode chip described here in accordance with one, a plurality or all of the embodiments described here can be produced by means of the method. In other words, all the features described for the light-emitting diode chip are also disclosed for the method for producing the light-emitting diode chip, and vice versa.

The method comprises, in accordance with at least one embodiment, the following steps:

Firstly, a p-doped layer is provided. The p-doped layer can be grown epitaxially, for example. For this purpose, an n-doped layer can be deposited epitaxially on a growth substrate. An active region can be deposited epitaxially on that side of the n-doped layer which is remote from the growth substrate. The active region is then succeeded by the p-doped layer, for example, which is likewise deposited epitaxially.

In a further method step, a mirror layer is applied to an outer area of the p-doped region. The outer area is in this case preferably that outer area of the p-doped layer which is remote from the active region.

This is followed by uncovering the p-doped layer in places by removing the mirror layer at least in places. That is to say that the mirror layer is removed in predetermined regions, such that the p-doped layer is uncovered below the mirror layer.

This is followed by applying an insulation layer into the regions freed of the mirror layer, wherein the mirror layer, at its side remote from the p-doped layer, terminates flush with the insulation layer and side areas of the p-doped layer directly adjoin the insulation layer. In other words, the regions in which the mirror layer has been removed are filled with the insulation layer. In this case, the thickness of the insulation layer is chosen such that it corresponds to the thickness of the mirror layer. In this case, "terminating flush" also encompasses embodiments wherein the mirror layer is thicker or thinner than the insulation layer by +/−10% of the thickness of the insulation layer. That is to say that, for example in a manner governed by production, the insulation layer can project slightly beyond the mirror layer or the mirror layer can project slightly beyond the insulation layer.

In this case, the insulation layer is applied in such a way that it nestles against the side areas of the mirror layer which are produced during the process of uncovering the p-doped layer, and is situated in direct contact with said side areas.

In a further method step, a carrier is applied at that side of the mirror layer which is remote from the p-doped layer. In this case, further layers such as barrier layers for suppressing diffusion of atoms and/or molecules from or into the mirror layer and connecting layers for mechanically connecting the carrier at the mirror layer can be situated between mirror layer and carrier.

Finally, the insulation layer is removed in places, wherein a hollow groove is produced between the carrier and the p-doped layer. Said hollow groove preferably extends completely around the p-doped layer in a lateral direction.

The hollow groove can subsequently be filled with a passivation material for forming a passivation layer. Said passivation material then serves for protecting the semiconductor body against moisture.

The light-emitting diode chip described here and also the method described here for producing a light-emitting diode chip are explained in greater detail below on the basis of exemplary embodiments and with reference to the associated figures.

In this case, FIGS. 1P and 1Q show schematic views of exemplary embodiments of light-emitting diode chips described here.

In conjunction with FIGS. 1A to 1Q, exemplary embodiments of methods described here for producing a light-emitting diode chip are explained in greater detail.

Elements which are identical, of identical type or act identically are provided with the same reference symbols in the figures. The figures and the size relationships of the elements illustrated in the figures among one another should not be regarded as to scale. Rather, individual elements may be illustrated with an exaggerated size in order to enable better illustration and/or in order to afford a better understanding.

DETAILED DESCRIPTION

Figure 1A:
FIGS. 1A to 1Q illustrate example embodiments of methods for producing a light-emitting diode chip.

FIG. 1P shows, on the basis of a schematic sectional view of a first exemplary embodiment of a light-emitting diode chip described here. The light-emitting diode chip comprises an n-conducting region 1 and a p-conducting region 2. An active region 3 to be provided for generating radiation is arranged between the n-conducting region 1 and the p-conducting region 2. In this case, the conducting regions 1, 2 and the active region 3 form the semiconductor body of the light-emitting diode chip. A mirror layer 4, which, for example, contains silver or consists of silver, is arranged at that side of the p-conducting region 2 which is remote from the n-conducting region 1. The mirror layer 4 has a perforation 41, in which the mirror layer is removed for example in a cylindrical region. The insulating layer 5, which in the present case consists of amorphous aluminium oxide, for example, is arranged at the side areas 4a of the mirror layer 4 which face the perforation 41.

The opening 8 adjoins the perforation 41 of the mirror layer 4 in a centred manner, said opening extending through the p-conducting region and the active zone 3 as far as the n-conducting region 1. A neutralized region 2" is arranged at side areas of the p-conducting region 2 which face the opening 8, said neutralized region being produced by neutralization of a p-doped layer 2'. In this case, the neutralized region 2" circumferentially encapsulates the p-conducting region 2 at the side areas thereof. The neutralized region 2" together with the p-conducting region 2 forms the p-doped layer 2'.

Perforation 41 and opening 8 are filled with an electrically conductive material 6, which contains silver and titanium, for example. In this case, the electrically conductive material 6 is likewise embodied such that it is reflective to the electromagnetic radiation generated in the active region 3, with the result that it forms a mirror for the electromagnetic radiation.

An electrically conductive layer 7 is arranged between the mirror layer 4 and the electrically conductive material 6 at that outer area of the mirror layer 4 which is remote from the p-conducting region, said electrically conductive layer containing gold, for example, and being formed for example by the layer sequence titanium/gold/titanium. The electrically conductive layer 7 serves for making electrical contact with the p-conducting region through the mirror layer 4. The electrically conductive layer 7 extends away from the mirror layer 4, the p-conducting region 2, the n-conducting region 1 and the active region 3 in a lateral direction 1. Outside the semiconductor body of the light-emitting diode chip, the electrically conductive layer 7 is freely accessible in places. The electrically conductive layer serves there for example as a p-side connection location, having a p-side connection region 16. Contact can be made there by means of a contact wire, for example.

Towards the electrically conductive material 6, the electrically conductive layer 7 is separated in an electrically insulating manner by means of the passivation layer 12. The electrically insulating layer 12 consists, for example, of silicon dioxide and has a thickness of, for example, between 400 nm and 600 nm, for example 450 nm.

In the present case, the electrically conductive material 6 serves for making electrical contact with the n-conducting region 1. In this case, the light-emitting diode chip is energized on the n side in the present case through a carrier 9, which is electrically conductively and mechanically fixedly connected to the electrically conductive material 6 by means of a connecting layer 14 containing gold, for example. In this case, a barrier layer 13 can be arranged between the electrically conductive material 6 and the connecting layer 14, said barrier layer containing titanium, for example. The barrier layer 13 prevents diffusion processes into or from the electrically conductive material 6.

The carrier 9 preferably consists of or comprises an electrically conductive material such as germanium, molybdenum, silicon or copper. In the exemplary embodiment in FIG. 1P, the carrier 9 is preferably produced electrolytically, that is to say that the carrier 9 is not connected to the remaining regions of the light-emitting diode chip by means of a bonding process. In this way, the passivation layer 12 is not exposed to excessively high thermal loading. The passivation layer 12, which consists of silicon dioxide, for example, remains impermeable to moisture in this way.

At its side remote from the carrier 9, the light-emitting diode chip is provided with a further passivation layer 15, which, in particular, fills a hollow groove 10 between the p-doped layer 2'' and the carrier 9. In this case, the passivation layer 15 is applied by means of ALD (atomic layer deposition), for example. By means of this method, the hollow groove 10 can be filled particularly well with the material of the further passivation layer 15. In this case, the passivation layer 15 can contain one of the following materials or consist of one of the following materials: $Al_2O_3$, $ZrO_2$, $TiO_2$, $HfO_2$.

The further passivation layer 15 is preferably embodied as radiation-transmissive, in particular transparent. The further passivation layer covers a roughening 101 at that side of the n-conducting layer 1 which is remote from the p-conducting layer, which is provided for reducing total reflection during the emergence of electromagnetic radiation. That outer area of the n-conducting layer 1 which faces the further passivation layer 15 and which is remote from the p-conducting region 2 forms the radiation passage area 102.

In contrast to the exemplary embodiment in FIG. 1P, a further exemplary embodiment of a light-emitting diode chip described here is described in conjunction with the exemplary embodiment of FIG. 1Q, wherein the passivation layer 12 has an opening 12' filled with the conductive material 6. In this way, the conductive material 6 extends laterally completely around all the semiconductor regions of the light-emitting diode chip.

In other words, an interruption extending around the entire light-emitting diode chip is introduced into the passivation layer 12 in the form of the opening 12' filled with the electrically conductive material 6. In this way, the light-emitting diode chip is laterally circumferentially encapsulated metallically with the electrically conductive material 6. In the exemplary embodiment of FIG. 1Q, the carrier 9 can be connected to the remaining regions of the light-emitting diode chip by means of a bonding process. A conductive semiconductor material such as silicon or germanium is then also appropriate as material for the carrier. On account of the interruption of the passivation layer 12 by the circumferentially extending opening 12', the thermal loading occurring as a result of the bonding proves not to be harmful. Without said thermal loading, the passivation layer 12 per se would already be impermeable to moisture. However, the thermal loading of the bonding opens paths for the moisture, which are interrupted by the opening 12'.

Exemplary embodiments of a method described here for producing a light-emitting diode chip are explained in greater detail in conjunction with the schematic sectional illustrations in FIGS. 1A to 1Q.

Firstly, a semiconductor layer stack is grown epitaxially on a growth substrate 11, which can be formed by sapphire, for example. The semiconductor layer stack comprises an n-conducting region 1 and a p-doped layer 2'. The active region 3 is arranged between the n-conducting region 1 and the p-doped layer 2', FIG. 1A.

Figure 1B:
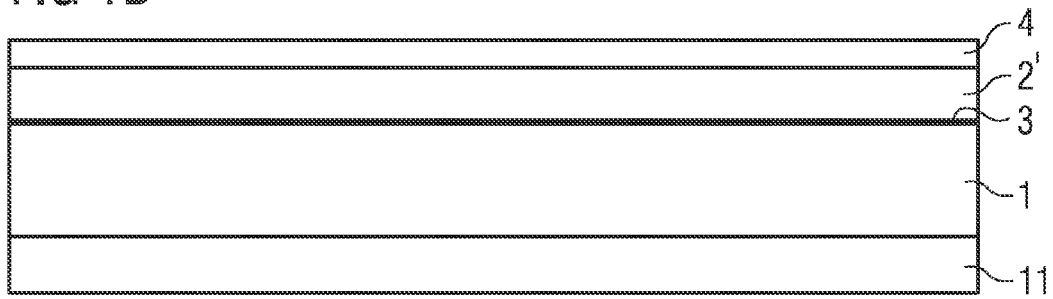

In a further method step, FIG. 1B, the mirror layer 4 is applied to that side of the p-doped layer 2' which is remote from the growth substrate, said mirror layer being deposited by vapour deposition, for example. The mirror layer 4 can comprise a silver layer, which can be provided with a covering layer composed of titanium at its side remote from the p-doped layer 2'.

Figure 1C:
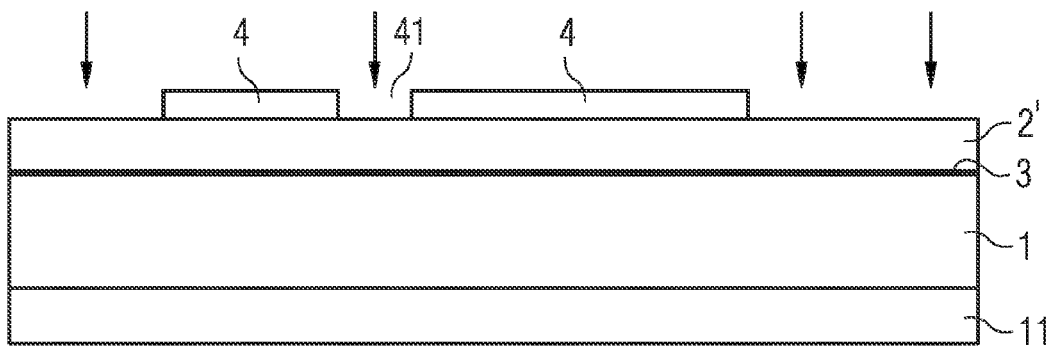

In the subsequent method step, FIG. 1C, by means of a photomask (not illustrated), a patterning of the mirror layer 4 is carried out by the mirror layer 4 being removed in places and the p-doped layer 2' being uncovered.

The photomask (not illustrated) also remains for the next method step, FIG. 1D, for neutralizing regions of the p-doped layer 2' to form neutralized regions 2''. This can be effected by means of Ar sputtering, for example. In this way, the p-conducting region 2 arises below the mirror layer 4 present, said p-conducting region being encapsulated laterally, that is to say in a lateral direction, circumferentially by the neutralized region 2'.

In a next method step, FIG. 1E, the insulation layer 5, composed of amorphous Al2O3 in the present case, is applied to the uncovered regions of the p-doped layer 2' by mean of sputtering. In this case, the insulating layer 5 covers side areas 4a of the mirror layer 4, in particular in the perforation 41. The thickness of the insulation layer 5 is chosen to be equal to the thickness of the mirror layer 4. This method step is also effected with the aid of the photomask applied for the method step in FIG. 1C. The photomask can subsequently be removed.

In a next method step, FIG. 1F, the electrically conductive layer 7, which later partly forms the p-type connection region of the light-emitting diode chip, is applied. By way of example, the electrically conductive layer 7 is a sequence of the following layers: titanium/gold/titanium.

In a further method step 1G, by means of CVD, for example, the passivation layer 12 is applied to the outer area remote from the growth substrate 11.

FIG. 1H illustrates an optional method step, wherein a circumferentially extending opening 12' that laterally encloses the mirror layer 4 is introduced into the passivation layer 12. A phototechnique is necessary for this purpose. This opening leads to the exemplary embodiment of FIG. 1Q. By means of the opening it is ensured that the passivation layer, which consists of silicon dioxide, for example, does not run as far as the edge of the light-emitting diode chip and open up there a possible moisture channel extending as far as the mirror layer 4.

In a further method step, FIG. 1I, the perforation 41 in the mirror layer 4 is uncovered by the removal of the passivation layer 12 and the insulating layer 5 and an opening 8 is produced through the p-conducting region 2 and the active region 3 as far as or right into the n-conducting region 1. A further phototechnique is necessary for this purpose.

In the next method step, FIG. 1J, the electrically conductive material 6 is applied to the uncovered outer areas remote from the growth substrate 11, the electrically conductive material 6 being formed for example by the following layers: titanium/silver/titanium.

The method step in FIG. 1K involves applying the carrier 9 by means of the connecting layer and the barrier layer 13 by means of bonding or electrodeposition.

Figure 1L:
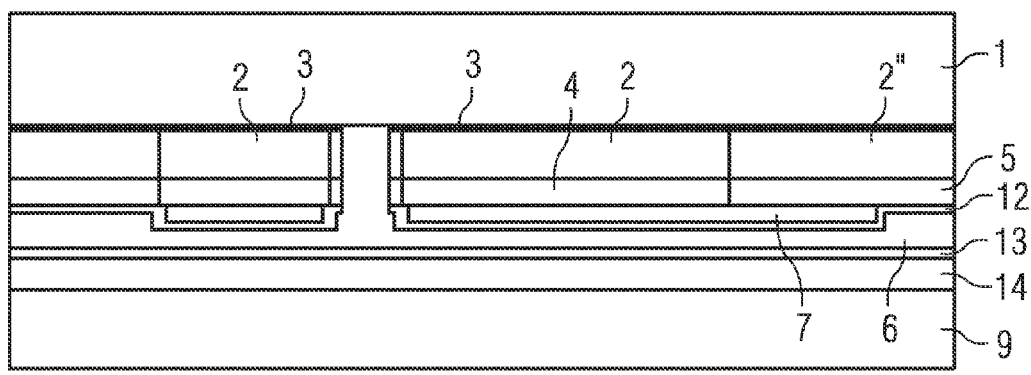

In the method step in FIG. 1L, the growth substrate is removed by means of a laser lift-off method, for example.

Figure 1M:
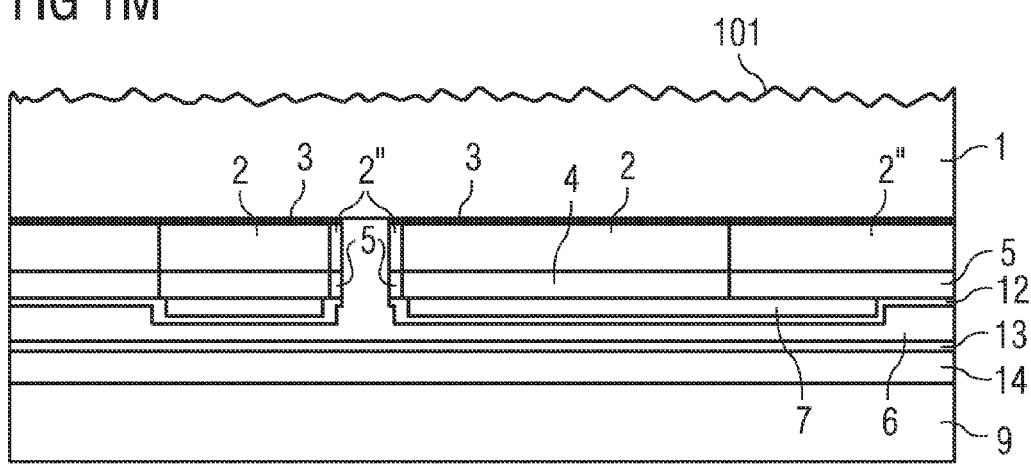

This is followed by the production of the roughenings 101 at that outer area of the n-conducting region 1 which is remote from the carrier 9, for example by means of KOH etching, see FIG. 1M.

Figure 1N:
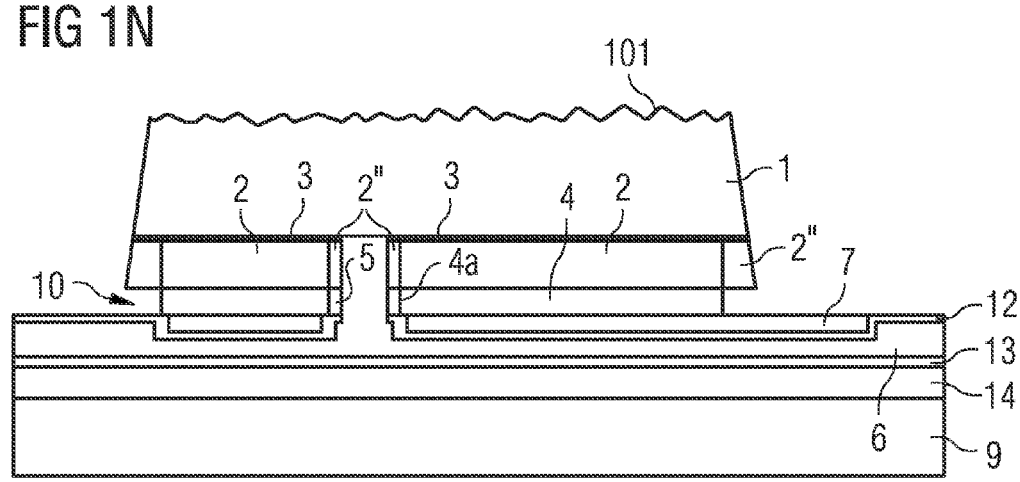

In a next method step, FIG. 1N, a mesa etch for example with the aid of H3PO4 is effected by means of a fourth phototechnique. In this case, the etchant stops for example on silver, but removes semiconductor material of the regions 1, 2, 2" and also the insulating layer 5. That is to say that the insulating layer 5 is removed under the neutralized region 2', such that a hollow groove arises, in which side areas of the mirror layer 4 are uncovered. In other words, after the patterning, the semiconductor body projects beyond the mirror layer 4 laterally in lateral directions. The passivation layer 12 remains unattacked by the etchant.

Figure 1O:
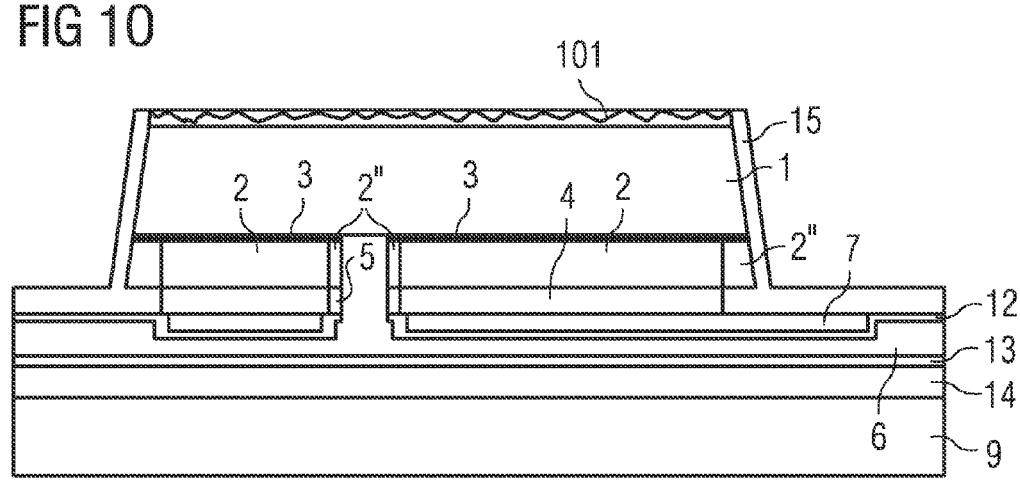

In a next method step, FIG. 1O, the further passivation layer 15 is applied, which, in particular, completely fills the hollow groove 10. In this case, the passivation layer 15 is preferably applied by means of ALD.

In a further method step, FIGS. 1P, 1Q, the further passivation layer 15 is removed in the region of the p-type connection region 16.

As an alternative to the exemplary embodiments shown, it is also possible for the light-emitting diode chip to be contact-connected on the n side not through the carrier 9, but rather by means of a further connection region at that side of the electrically conductive material 6 which is remote from the carrier 9. In this case, an electrically insulating material can also be used for the carrier.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

This patent application claims the priority of German patent application 10 2010 044 986.5, the disclosure content of which is hereby incorporated by reference.

LIST OF REFERENCE SYMBOLS 1 n-conducting region
101 roughening
102 radiation passage area
2 p-conducting region
2' p-doped layer
2'a side area of the p-doped layer
2" neutralized region
3 active region
4 mirror layer
4a side area of the mirror layer
41 perforation
5 insulation layer
6 electrically conductive material
7 electrically conductive layer
8 opening
9 carrier
10 hollow groove (also undercut or fillet)
11 growth substrate
12 passivation layer
12' opening in the passivation layer
13 barrier layer
14 connecting layer
15 further passivation layer
16 connection region

The invention claimed is:

1. A light-emitting diode chip comprising:
an n-conducting region;
a p-conducting region;
an active region between the n-conducting region and the p-conducting region;
a mirror layer at that side of the p-conducting region which is remote from the active region; and
an insulation layer formed with an electrically insulating material,
wherein the mirror layer is designed for reflecting electromagnetic radiation generated in the active region,
wherein the mirror layer has a perforation,
wherein a side area of the mirror layer is completely covered by the insulation layer in the region of the perforation,
wherein the remaining outer area of the mirror layer is free of the insulation layer, and
wherein the insulation layer does not project beyond the mirror layer in a vertical direction.

2. The light-emitting diode chip according to the claim 1, wherein the insulation layer can be etched by means of an orthophosphoric acid.

3. The light-emitting diode chip according to claim 1, wherein
the insulation layer consists of an amorphous ceramic material.

4. The light-emitting diode chip according to claim 1, wherein the insulation layer is formed with amorphous Al2O3 or consists of amorphous Al2O3.

5. The light-emitting diode chip according to claim 1, wherein the perforation adjoins an opening extending through the p-conducting region and the active region right into or as far as the n-conducting region.

6. The light-emitting diode chip according to claim 1, wherein the perforation and the opening are filled with an electrically conductive material, wherein the insulation layer is arranged between the electrically conductive material and the mirror layer.

7. The light-emitting diode chip according to claim 1, further comprising:
a radiation passage area, which is formed in places by an outer area of the n-conducting region which is remote from the p-conducting region, wherein a current distribution for energizing the active region during the operation of the light-emitting diode chip is effected below the radiation passage area.

8. The light-emitting diode chip according to claim 1, wherein the mirror layer contains silver or consists of silver.

9. The light-emitting diode chip according to claim 1, wherein an electrically conductive layer is arranged at that outer area of the mirror layer which is remote from the p-conducting region, said electrically conductive layer projecting beyond the mirror layer, the n-conducting region, the p-conducting region and the active region in a lateral direction, wherein the electrically conductive layer is freely accessible in places at its side facing the mirror layer.

10. The light-emitting diode chip according to claim 1, wherein the electrically conductive material is separated from the electrically conductive layer in an electrically insulating fashion by means of a passivation layer, wherein the passivation layer has an opening filled with the electrically conductive material.

11. The light-emitting diode chip according to claim 1, wherein the insulation layer has the same thickness as the mirror layer.

12. The light-emitting diode chip according to claim 1, wherein an electrically conductive layer is arranged at the outer area of the mirror layer which is remote from the p-conducting region,
    wherein the electrically conductive material is separated from the electrically conductive layer in an electrically insulating fashion by means of a passivation layer, and
    wherein the remaining outer areas are free of any electrically insulating material with the exception of the passivation layer.

13. The light-emitting diode chip according to claim 1, wherein the insulation layer is arranged solely at the side area in the region of the perforation, wherein the mirror layer comprises outer side areas that are free of the insulation layer, and wherein the outer side areas are covered by a further passivation layer.

14. The light-emitting diode chip according to claim 1, wherein the mirror layer does not project beyond the perforation in the vertical direction.

15. The light-emitting diode chip according to claim 1, wherein the p-conducting region comprises an inner side face in the region of the perforation, wherein the inner side face of the p-conducting region is covered by a neutralized region, and wherein the neutralized encapsulates the p-conducting region at the inner side face of the p-conducting region.

16. A method for producing a light-emitting diode chip, comprising the following steps:
    providing a p-doped layer;
    applying a mirror layer to an outer area of the p-doped layer;
    uncovering the p-doped layer in places by removing the mirror layer in places;
    applying an insulation layer into the regions freed of the mirror layer wherein the mirror layer at its side remote from the p doped layer, terminates flush with the insulation layer and side areas of the p-doped layer directly adjoin the insulation layer;
    applying a carrier at that side of the mirror layer which is remote from the p-doped layer; and
    removing the insulation layer in places in order to produce a hollow groove between the carrier and the p-doped layer,
    wherein the insulation layer does not project beyond the mirror layer in a vertical direction.

17. The method according to claim 16, wherein the hollow groove is completely filled with a passivation material for forming a further passivation layer.

18. A light-emitting diode chip comprising:
    an n-conducting region;
    a p-conducting region;
    an active region between the n-conducting region and the p-conducting region;
    a mirror layer at that side of the p-conducting region which is remote from the active region;
    an insulation layer formed with an electrically insulating material; and
    an electrically conductive layer at that side of the mirror layer which is remote from the p-conducting region;
    wherein the mirror layer is designed for reflecting electromagnetic radiation generated in the active region,
    wherein the mirror layer has a perforation,
    wherein the mirror layer has an inner side area in the region of the perforation and a bottom area which is remote from the p-conducting region;
    wherein the inner side area of the mirror layer is completely covered by the insulation layer,
    wherein the bottom area of the mirror layer is in direct contact with an electrically conductive layer,
    wherein substantially the entire bottom area is covered by the electrically conductive layer, and
    wherein the mirror layer is not freely accessible or all outer areas of the mirror layer are completely covered by at least one component of the light-emitting diode chip.

19. The light-emitting diode chip according to claim 18, wherein the bottom area of the mirror layer is free of the insulation layer.

* * * * *